US008228118B1

(12) United States Patent
Hsieh

(10) Patent No.: US 8,228,118 B1
(45) Date of Patent: Jul. 24, 2012

(54) SWITCHING AMPLIFIER USING CAPACITOR FOR TRANSMITTING ENERGY

(76) Inventor: Wen-Hsiung Hsieh, Keelung (TW)

( * ) Notice: Subject to any disclaimer, the term of this patent is extended or adjusted under 35 U.S.C. 154(b) by 0 days.

(21) Appl. No.: 13/235,352

(22) Filed: Sep. 17, 2011

(51) Int. Cl.
H03F 3/38 (2006.01)
(52) U.S. Cl. ................. 330/10; 330/251; 330/207 A
(58) Field of Classification Search .......... 330/10, 330/251, 207 A
See application file for complete search history.

(56) References Cited

U.S. PATENT DOCUMENTS

| | | | |
|---|---|---|---|
| 3,629,616 A | 12/1971 | Walker | |
| 4,531,096 A | 7/1985 | Yokoyama | |
| 5,014,016 A | 5/1991 | Anderson | |
| 5,115,205 A | 5/1992 | Holmes, Jr. | |
| 5,160,896 A | 11/1992 | Mccorkle | |
| 5,767,740 A | 6/1998 | Fogg | |
| 5,805,020 A | 9/1998 | Danz | |
| 5,949,282 A | 9/1999 | Nguyen | |
| 6,252,784 B1 * | 6/2001 | Dobrenko | 363/21.12 |
| 6,356,151 B1 | 3/2002 | Nalbant | |
| 6,563,377 B2 | 5/2003 | Butler | |
| 6,683,494 B2 * | 1/2004 | Stanley | 330/10 |
| 6,794,932 B1 | 9/2004 | Butler | |
| 6,922,101 B2 | 7/2005 | Bayko | |
| 7,286,008 B2 | 10/2007 | Watts | |
| 7,348,840 B2 * | 3/2008 | Magrath et al. | 330/10 |
| 7,400,191 B2 | 7/2008 | Rodriguez | |
| 7,816,985 B2 | 10/2010 | Attwood et al. | |
| 7,863,841 B2 * | 1/2011 | Menegoli et al. | 318/400.29 |
| 7,940,535 B2 * | 5/2011 | Itoh et al. | 363/21.12 |
| 7,952,426 B2 | 5/2011 | Mun | |
| 8,022,756 B2 * | 9/2011 | Walker et al. | 330/10 |
| 2008/0136350 A1 * | 6/2008 | Tripathi et al. | 315/294 |

* cited by examiner

Primary Examiner — Patricia Nguyen

(57) ABSTRACT

A switching amplifying method or a switching amplifier for obtaining a linearly amplified replica of an input signal, is highly efficient, and does not have the disadvantage of "dead time" problem related to class D amplifiers. Another aspect of the present invention provides a switching amplifier that is completely off when there is no input signal. Yet another aspect of the present invention further comprises an act of comparing an input signal with an output feedback signal for detection and correction of overall system signal processes therefore does not require a power supply regulator and is substantially immune to power supply and load perturbations.

19 Claims, 5 Drawing Sheets

SWITCHING AMPLIFIER USING CAPACITOR FOR TRANSMITTING ENERGY

BACKGROUND OF THE INVENTION (1) Field of the Invention

This invention is related in general to a power amplifier, and more particularly, to a switching amplifier that can efficiently and linearly amplify an input signal having first and second polarities for obtaining a low-distortion output signal.

(2) Description of the Related Art

Amplifiers are electronic devices which are used for increasing the power of a signal, and are generally categorized into various classes. The popular amplifiers include class A, class B and class D amplifiers. Reference is made to the exemplary U.S.Ppatents that disclose various types of amplifiers: U.S. Pat. Nos. 7,952,426; 7,816,985; 7,400,191; 7,286,008; 6,922,101; 6,794,932; 6,563,377; 6,356,151; 6,282,747; 5,949,282; 5,805,020; 5,767,740; 5,160,896; 5,115,205; 5,014,016; 4,531,096 and 3,629,616.

In general, class A amplifiers produce a linearly amplified replica of an input signal, but are inefficient in terms of power usage because the amplifying elements are always biased and conducting, even if there is no input.

Class B amplifiers only amplify half of the input wave cycle, thus creating a large amount of distortion, but their efficiency is greatly improved and is much better than class A. A practical circuit using class B elements is the push-pull stage, such as the very simplified complementary pair arrangement. Complementary or quasi-complementary devices are each used for amplifying the opposite halves of the input signal, which is then recombined at the output. This arrangement gives excellent efficiency, but can suffer from the drawback that there is a small mismatch in the cross-over region—at the "joins" between the two halves of the signal, as one output device has to take over supplying power exactly as the other finishes. This is called crossover distortion.

In a class D amplifier an input signal is converted to a sequence of higher voltage output pulses. The averaged-over-time power values of these pulses are directly proportional to the instantaneous amplitude of the input signal. The frequency of the output pulses is typically ten or more times the highest frequency in the input signal to be amplified. The output pulses contain inaccurate spectral components (that is, the pulse frequency and its harmonics) which must be removed by a low-pass passive filter. The resulting filtered signal is then a linearly amplified replica of the input.

The main advantage of a class D amplifier is power efficiency. Because the output pulses have fixed amplitude, the switching elements are switched either completely on or completely off, rather than operated in linear mode.

However, one significant challenge for a driver circuit in class D amplifiers is keeping dead times as short as possible. "Dead time" is the period during a switching transition when both output MOSFETs are driven into Cut-Off Mode and both are "off". Dead times need to be as short as possible to maintain an accurate low-distortion output signal, but dead times that are too short cause the MOSFET that is switching on to start conducting before the MOSFET that is switching off has stopped conducting. The MOSFETs effectively short the output power supply through themselves, a condition known as "shoot-through". Driver failures that allow shoot-through result in excessive losses and sometimes catastrophic failure of the MOSFETs.

Therefore, the main disadvantage of a class D amplifier is having the "dead time" problem to cause the distortion of the output signal.

In summary, class A amplifiers produce a linearly amplified replica of an input signal, but are inefficient in terms of power usage. The push-pull class B amplifiers provide excellent efficiency (compared to class A amplifiers), but introduce crossover distortion. Class D amplifiers are most efficient compared to class A and class B amplifiers, but there is one significant problem for MOSFET driver circuits in class D amplifiers: the "dead time" that cause the distortion of the output signal.

Accordingly, in light of current state of the art and the drawbacks to current amplifiers mentioned above. A need exits for a switching amplifier that would continue to be highly efficient, that would efficiently and linearly amplify an input signal for generating low-distortion output signals.

SUMMARY OF THE INVENTION

The present invention discloses a switching amplifier that produces a linearly amplified replica of an input signal, is highly efficient, and does not have the "dead time" problem related to class D amplifiers.

One aspect of the present invention provides a method of obtaining an output signal from a direct current (DC) current source, wherein the output signal is a linearly amplified replica of an input signal, comprising the steps of: receiving the input signal; transforming and pulse modulating the input signal for generating a pulse modulated signal, wherein said transforming is based on that when applying a constant current to a capacitor means, the energy stored in the capacitor means is proportional to square of the applying time; switching the constant current from the direct current (DC) current source to the capacitor means according to the pulse modulated signal; blocking a current from the capacitor means to a filter when the constant current from the direct current (DC) current source to the capacitor means is switched on and conducting the current from the capacitor means to the filter for transmitting energy stored in the capacitor means to the filter unit when the constant current from the direct current (DC) current source to the capacitor means is switched off for generating a pulsed output signal; filtering the pulsed output signal for outputting the output signal by the filter.

Yet another aspect of the present invention provides a method of obtaining an output signal from a direct current (DC) current source, wherein the output signal is a linearly amplified replica of an input signal, comprising the steps of: receiving the input signal; transforming the input signal for generating a discrete time peak voltage signal, wherein said transforming is based on that when applying a current to a capacitor means, the energy stored in the capacitor means is proportional to square of the peak voltage across the capacitor means; switching a current from the direct current (DC) current source to the capacitor means and getting a feedback voltage signal by detecting voltage across the capacitor means, wherein said switching is according to the discrete time peak voltage signal and the feedback voltage signal; blocking a current from the capacitor means to a filter when the current from the direct current (DC) current source to the capacitor means is switched on and conducting the current from the capacitor means to the filter for transmitting energy stored in the capacitor means to the filter unit when the current from the direct current (DC) current source to the capacitor means is switched off for generating a pulsed output signal; filtering the pulsed output signal for outputting the output signal by the filter.

From the switching amplifier in accordance with the present invention, one aspect of the present invention provides a switching amplifier that is highly efficient and without the "dead time" problem related to the class D amplifiers.

From the switching amplifier in accordance with the present invention, another aspect of the present invention provides a switching amplifier that is completely off when there is no input signal.

From the switching amplifier in accordance with the present invention, yet another aspect of the present invention provides a switching amplifier which comprised of an act of comparing an input signal with an output feedback signal for detection and correction of overall system signal processes therefore is substantially immune to a current source supply and load perturbations.

BRIEF DESCRIPTION OF THE DRAWINGS

The above and other features and advantages of the present general inventive concept will become more apparent by describing in detail exemplary embodiments thereof with reference to the attached drawings in which.

DETAILED DESCRIPTION OF THE PREFERRED EMBODIMENTS

The detailed description set forth below in connection with the appended drawings is intended as a description of presently preferred embodiments of the invention and is not intended to represent the only forms in which the present invention may be constructed and or utilized.

Figure 1:
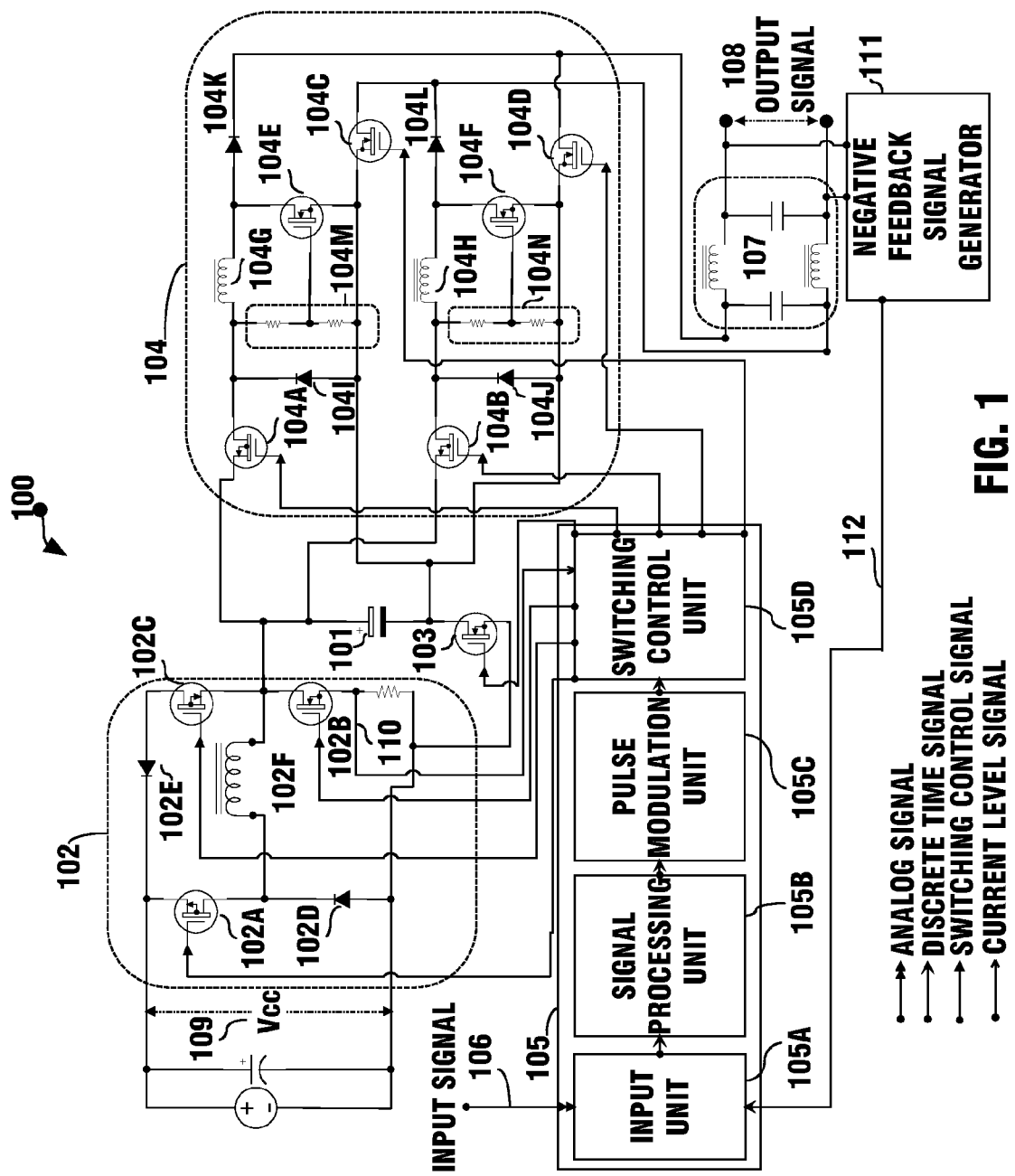
FIG. 1 is an exemplary block and circuit diagram illustrating a first embodiment of a switching amplifier in accordance with the first method of present invention.

FIG. 1 is an exemplary block and circuit diagram illustrating an embodiment of a switching amplifier 100 in accordance with the first method of present invention, wherein the capacitor means 101 is a capacitor.

As illustrated in FIG. 1, the switching amplifier 100 of the present invention for amplifying an input signal 106 having positive and negative polarities is comprised of: a capacitor means 101; a current regulator unit 102 comprising switches 102A, 102B, 102C, diodes 102D, 102E and an inductor 102F for supplying a direct current (DC) constant current to the capacitor means 101 from a direct current (DC) voltage 109; a switching unit 103 for switching the constant current from the current regulator unit 102 to the capacitor means 101; a switching power transmitting unit 104 coupled between the capacitor unit 101 and a filter unit 107 for blocking a current from the capacitor unit 101 to the filter unit 107 when the current from the current regulator unit 102 to the capacitor means 101 is switched on by the switching unit 103, and conducting the current from the capacitor means 101 to the filter unit 107 for transmitting energy stored in the capacitor means 101 to the filter unit 107 when the current from the current regulator unit 102 to the capacitor unit 101 is switched off; the filter unit 107 outputting the output signal 108.

In this non-limiting exemplary embodiment, the input signal 106 is an analog signal. And it should be noted that it is obvious for a corresponding embodiment of a switching amplifier in accordance with this invention for an input signal which is a discrete time signal.

As further illustrated in FIG. 1, the capacitor means 101 is a polarized capacitor. Accordingly, when the constant current from the current regulator unit 102 to the capacitor means 101 is switched on, the current from the capacitor means 101 to the filter unit 107 is blocked by the switching power transmitting unit 104. Therefore, during this switched on period, the voltage across the capacitor means 101 builds up linearly from zero to a peak value. Further, when the constant current from the current regulator unit 102 to the capacitor means 101 is switched off, the current from the capacitor means 101 to the filter unit 107 is conducted by the switching power transmitting unit 104 for delivering previously stored energy to the filter unit 107.

Therefore, during the period when the constant current from the current regulator unit 102 to the capacitor means 101 is switched on, the constant current from the current regulator unit 102 is applied to the capacitor means 101, and the voltage across the capacitor means 101 builds up linearly from zero to a peak value which is proportional to the switched on period. Furthermore, during the switched on period, the energy stored in the capacitor means 101 is based on the equation:

$$E = \frac{C(V_p)^2}{2}$$

wherein E is the energy stored in the capacitor means 101, C is the capacitance of the capacitor means 101, and $V_p$ is the peak value of the voltage across the capacitor means 101 at the end of the switched on period. Since the peak value $V_p$ is proportional to the switched on period $T_{on}$:

$$V_p \propto T_{on} ==> E \propto (T_{on})^2$$

therefore, the energy stored into the capacitor means 101 during a switched on period is proportional to square of the switched on period.

As further illustrated in FIG. 1, the amplifier control unit 105 comprises an input unit 105A for receiving the input signal 106 and having an analog to digital converter for converting the input signal 106 to a discrete time input signal x[n]

$$x=\{x[n]\}, 0<n<\infty;$$

a signal processing unit 105B for transforming the discrete time input signal x[n] to a transformed signal y[n] according to the following equation:

$$y[n]=\sqrt[2]{x[n]}, 0<n<\infty;$$

a pulse modulation unit 105C for getting a pulse modulated signal from pulse modulating the transformed signal y[n] from the signal processing unit 105B; and a switching control unit 105D coupled to the switches 102A, 102B and 102C of the current regulator unit 102; the switching unit 103 and the switches 104A, 104B, 104C and 104D of the switching power transmitting unit 104 to control their switching according to the pulse modulated signal from the pulse modulation unit 105C.

In this non-limiting exemplary embodiment 100, the amplifier control unit 105 is a digital signal processing circuit.

And it is obvious for a corresponding embodiment of an analog signal processing circuit for the amplifier control unit 105 in accordance with this invention by using an input unit for receiving an analog input signal and a pulse modulator for pulse modulating said analog input signal.

Figure 2:
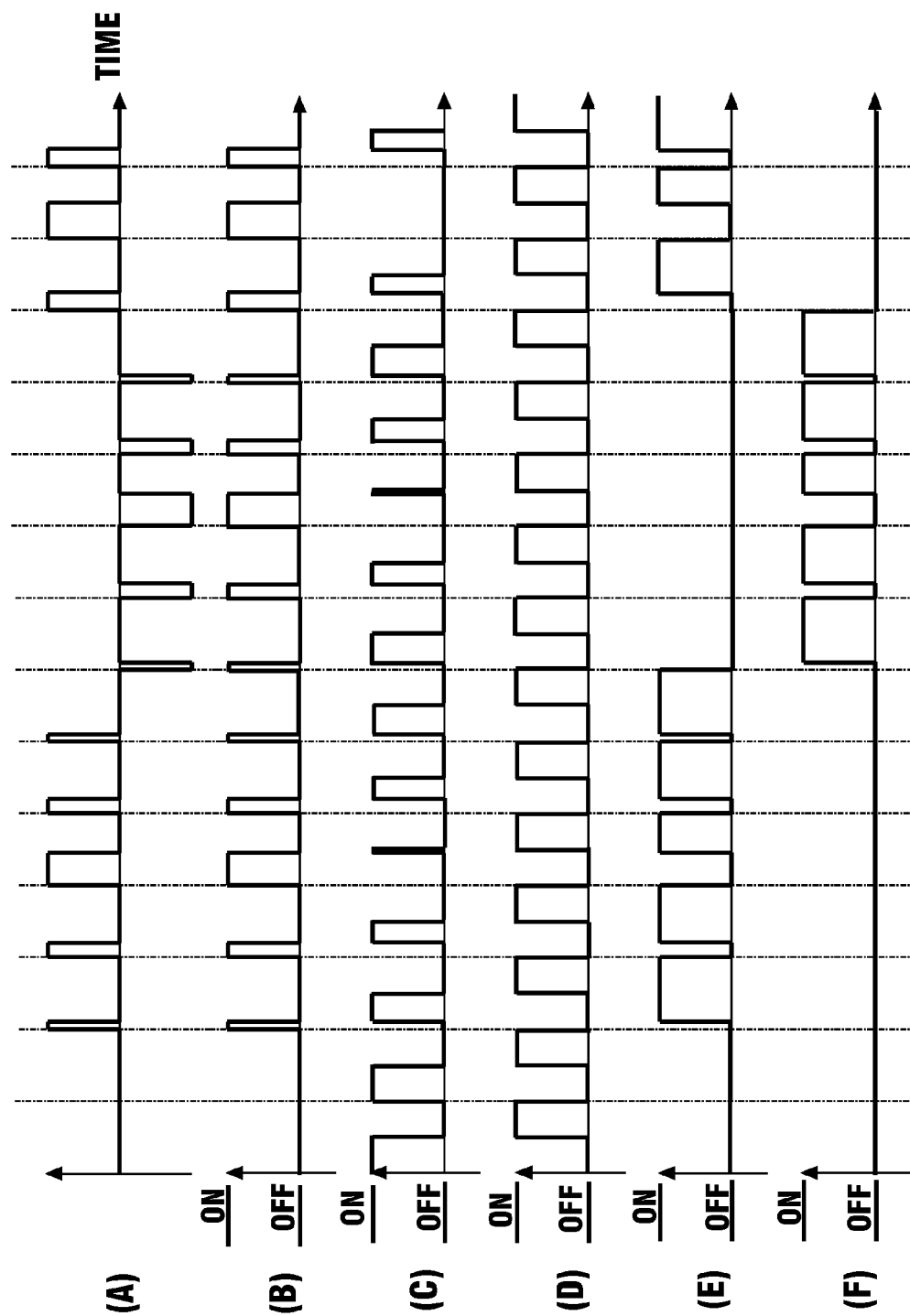
FIG. 2 are exemplary waveform diagrams illustrating the various waveforms at input and output points of a switching control unit of various figures in accordance with the present invention.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105C is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signals from the switching control unit 105D to the switches 102A and 102B for controlling their switching are illustrated in FIG. 2(D); a non-limiting exemplary waveform of switching control signal from the switching control unit 105D to the switch 102C for controlling its switching is illustrated in FIG. 2(C); and a non-limiting exemplary waveform of switching control signal from the switching control unit 105D to the switch 103 for controlling its switching are illustrated in FIG. 2(B). Also according to the pulse modulated signal illustrated in FIG. 2(A), non-limiting exemplary waveforms of switching control signals from the switching control unit 105D to the switches 104A, 104C and 104B, 104D are illustrated in FIG. 2(E) and FIG. 2(F), respectively.

Accordingly, as illustrated in FIG. 1 and FIG. 2, when the input signal 106 is zero, the switches 103 and the switches 104A, 104B, 104C, 104D of the switching power transmitting unit 104 are all switched off. The switches 102A, 102B and 102C switch on and off alternatively to charge and discharge the inductor 102F to provide a constant current: when the switches 102A, 102B switch on and 102C switches off, the inductor 102F is charging energy from the direct current (DC) voltage 109; and when the switches 102A, 102B switch off and 102C switches on, the energy contained in the inductor 102F is discharged back to the direct current (DC) voltage 109. Therefore, at steady state, for approximately equal charging and discharging time, the energy flow in and out of the inductor 102F are equal during each switching, therefore, this switching keeps the energy stored in the inductor 102F constant. For the inductance of the inductor 102F is large enough and the switching frequency of the switches 102A, 102B and 102C is fast enough, the current flow through the inductor 102F keeps approximately constant since its variation is small enough. When the input signal 106 is not zero, the switch 103 switch on and off according to the pulse modulated signal to switch on the current from the inductor 102F to the capacitor 101. As illustrated in FIG. 1 and FIG. 2(A)~2(D), the switches 102A, 102B and 102C, 103 switch alternatively to keep the energy stored in the inductor 102F constant, therefore when the switch 103 is switched on, the current from the inductor 102F to the capacitor 101 keeps constant.

As illustrated in FIG. 1 and FIG. 2(A), 2(B), 2(E), 2(F), the switches 104A~104D switch for blocking the current from the capacitor means 101 to the filter unit 107 when the constant current from the inductor 102F to the capacitor 101 is switched on by the switching unit 103; and conducting the current from the capacitor means 101 to the filter unit 107 when the constant current from the inductor 102F to the capacitor 101 is switched off.

As illustrated in FIG. 1 and FIG. 2, for the polarity of the pulse modulated signal is positive therefore the switches 104A and 104C switch on when the switch unit 103 switches off, the switch 104E is switched on by the voltage across the capacitor 101 through a voltage divider 104M and the diode 104K is reverse biased, therefore, the voltage across the capacitor 101 is applied to the inductor 104G that cause a current flow from the capacitor 101 to the inductor 104G until the energy contained in the capacitor 101 is nearly zero, and when the energy contained in the capacitor 101 is nearly zero, the switch 104E is switched off since the voltage across the capacitor 101 is nearly zero, then the diodes 104K and 104I are forward biased to transmit the energy contained in the inductor 104G to the filter 107. For the polarity of the pulse modulated signal is negative therefore the switches 104B and 104D switch on when the switch unit 103 switches off to transmit energy contained in the capacitor 101 to the filter 107 through the inductor 104H, respectively.

As further illustrated in FIG. 1, the filter unit 107 is a low pass filter to obtain the output signal 108 corresponding to the input signal 106 by filtering the output of the switching power transmitting unit 104 and outputting the output signal 108.

As further illustrated in FIG. 1 and FIG. 2, the level of the output signal 108 can be adjusted by control the current level of the inductor 102F. Based on the current level feedback signal 110 representing a current flow through the inductor 102F, the switching control unit 105D can adjust the current flow through the inductor 102F by changing the duty ratio between the charging and discharging periods of the inductor 102F according to the current level feedback signal 110.

As further illustrated in FIG. 1, the switching amplifier 100 further comprises a negative feedback signal generator 111 to generate a negative feedback signal corresponding to the output signal 112, wherein the amplifier control unit 105 integrates the input signal 106 and the negative feedback signal 112.

Figure 3:
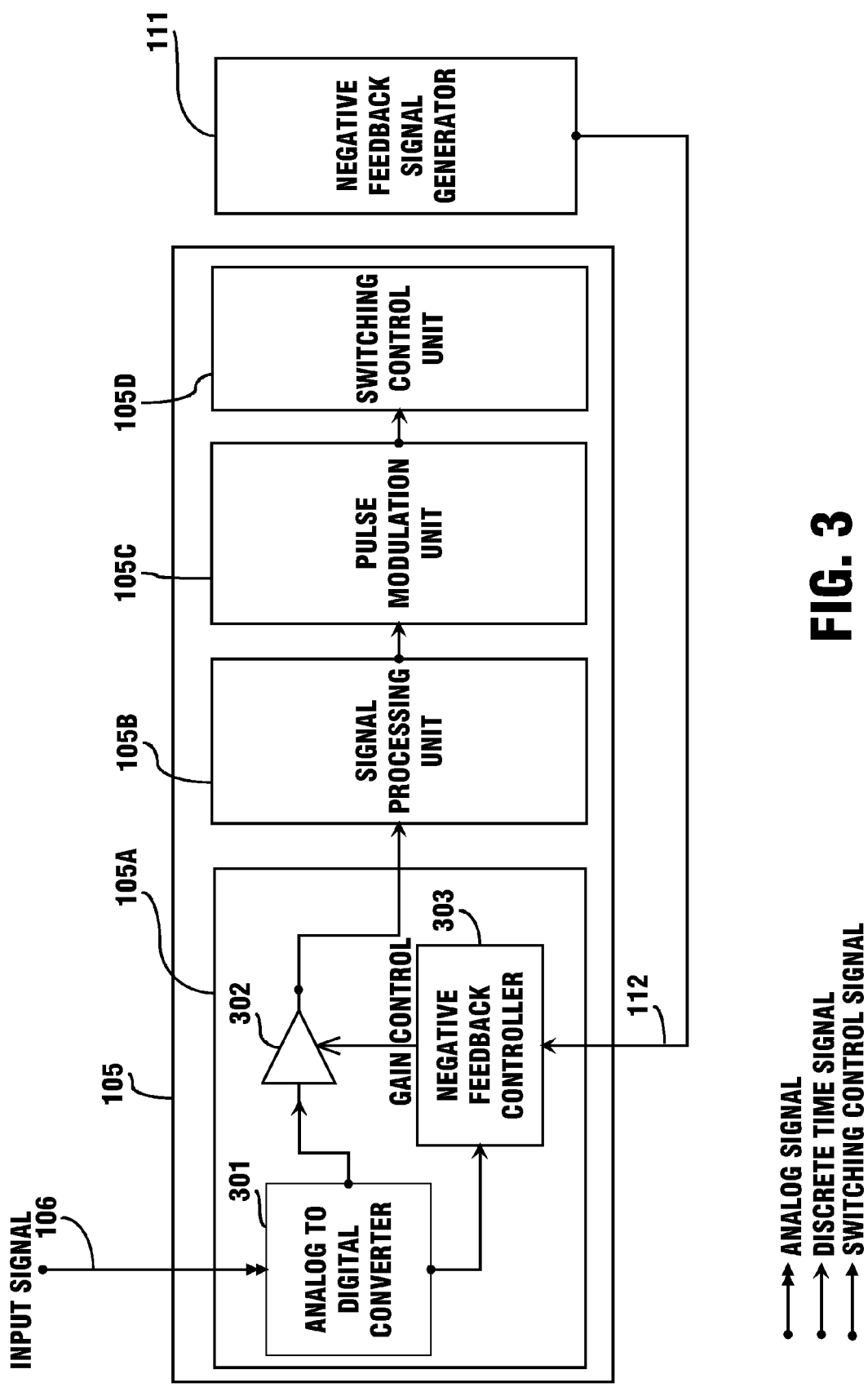
FIG. 3 is an exemplary block and circuit diagram illustrating an embodiment of the amplifier control unit integrating an input signal and a negative feedback signal in FIGS. 1 and 5 in accordance with the present invention.

FIG. 3 is an exemplary block and circuit diagram illustrating an embodiment of the amplifier control unit 105 integrating the input signal 106 and a negative feedback signal 112 in FIG. 1 in accordance with the present invention.

As illustrated in FIG. 3 and FIG. 1, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\},\ 0<n<\infty;$$

The linear digital transformer 302 transforms the discrete time input signal x[n] by multiplying a gain G to the discrete time input signal (the default value of the gain G is 1):

$$X[n]=\{G \times x[n]\},\ 0<n<\infty$$

to get a compensated discrete time signal X[n] and sends the compensated discrete time signal X[n] to the signal processing unit 105B.

Accordingly, for the switching amplifier 100 further comprises the negative feedback signal generator 111 to generate the negative feedback signal corresponding to the output signal 112 and the amplifier control unit 105 integrates the input signal 106 and the negative feedback signal 112, the signal processing unit 105B receives the compensated discrete time signal X[n], and the output of the signal processing unit 105B is:

$$y[n]=\sqrt[2]{X[n]},\ 0<n<\infty.$$

As further illustrated in FIG. 3, the negative feedback controller 303 receives the discrete time input signal from the analog to digital converter 301 and compares it to the negative feedback signal 112, therefore to adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

In this non-limiting exemplary embodiment 100, the amplifier control unit 105 is a digital signal processing circuit. And it is obvious for a corresponding embodiment of an analog signal processing circuit for the amplifier control unit 105 in accordance with this invention by using an analog input unit for receiving an analog input signal, a programmable gain amplifier for amplifying the an analog input signal and a pulse modulator for pulse modulating said amplified analog signal.

Figure 4:
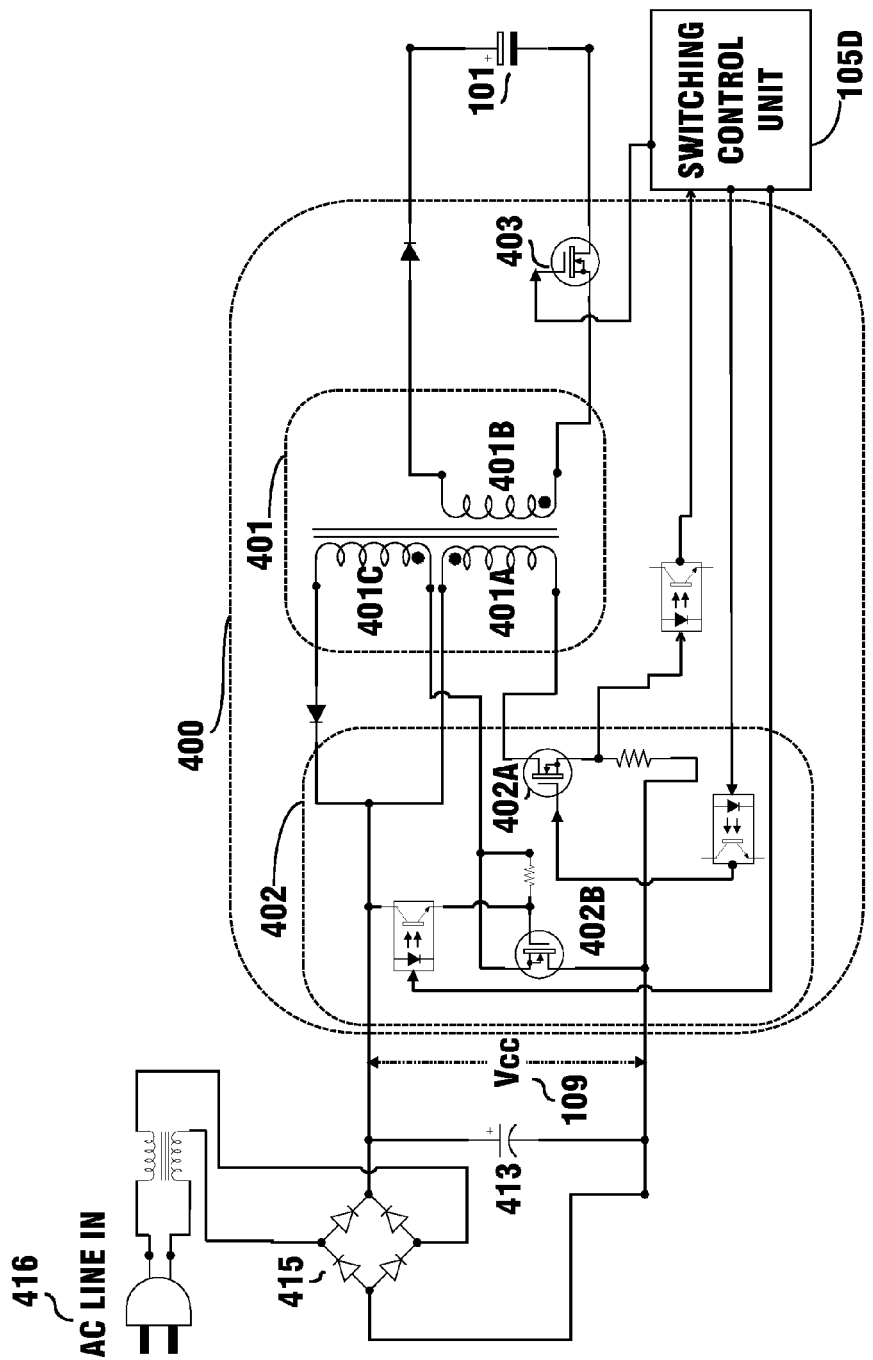
FIG. 4 is an exemplary block and circuit diagram illustrating another embodiment of a current regulator unit using a flyback transformer in accordance with the present invention to provide electric isolation between an AC Line in and a switching amplifier 100 or 500.

FIG. 4 is an exemplary block and circuit diagram illustrating another embodiment of a current regulator unit 400 using a flyback transformer in accordance with the present invention to provide electric isolation between an AC Line 416 in and a switching amplifier 100 or 500.

As illustrated in FIG. 4, the current regulator unit 400 provides a constant current from a flyback transformer 401 to the capacitor 101. For replacing the current regulator unit 102 in FIG. 1 by the current regulator unit 400, when the input signal 106 is zero, the switches 103 and the switches 104A, 104B, 104C, 104D of the switching power transmitting unit 104 are all switched off. The switches 402A and 402B switch on and off alternatively to charge and discharge the flyback transformer 401 to provide a constant current: when the switches 402A switches on and 402B switches off, the flyback transformer 401 is charging energy from the direct current (DC) voltage 109, and when the switches 402A switches off and 402B switches on, the energy contained in the flyback transformer 401 is discharged back to the direct current (DC) voltage 109. Therefore, at steady state, for approximately equal charging and discharging time at each switching period, the energy flow in and out of the flyback transformer 401 are equal during each switching, therefore, this switching keeps the energy stored in the flyback transformer 401 constant. For the inductance of the flyback transformer 401 is large enough and the switching frequency is fast enough, the current flow the flyback transformer 401 is approximately constant since its variation is small enough.

When the input signal 106 is not zero, the switch 403 switch on and off according to the pulse modulated signal to switch on the current from the flyback transformer 401 to the capacitor 101. As illustrated in FIG. 1 and FIG. 2(A)~2(D), the switches 402A, and 402B, 403 switch alternatively to keep the energy stored in the flyback transformer 401 constant, therefore when the switch 403 is switched on, the current from the flyback transformer 401 to the capacitor 101 keeps approximately constant.

As further illustrated in FIG. 1 and FIG. 4, the switching amplifier 100 further comprises a rectifying unit 415 and a smoothing unit 413 to rectify and smooth an alternating current (AC) voltage 416 and to provide the direct current (DC) voltage 109, wherein the rectifying unit 415 is a full bridge rectifier and the smoothing unit 413 is a capacitor.

Figure 5:
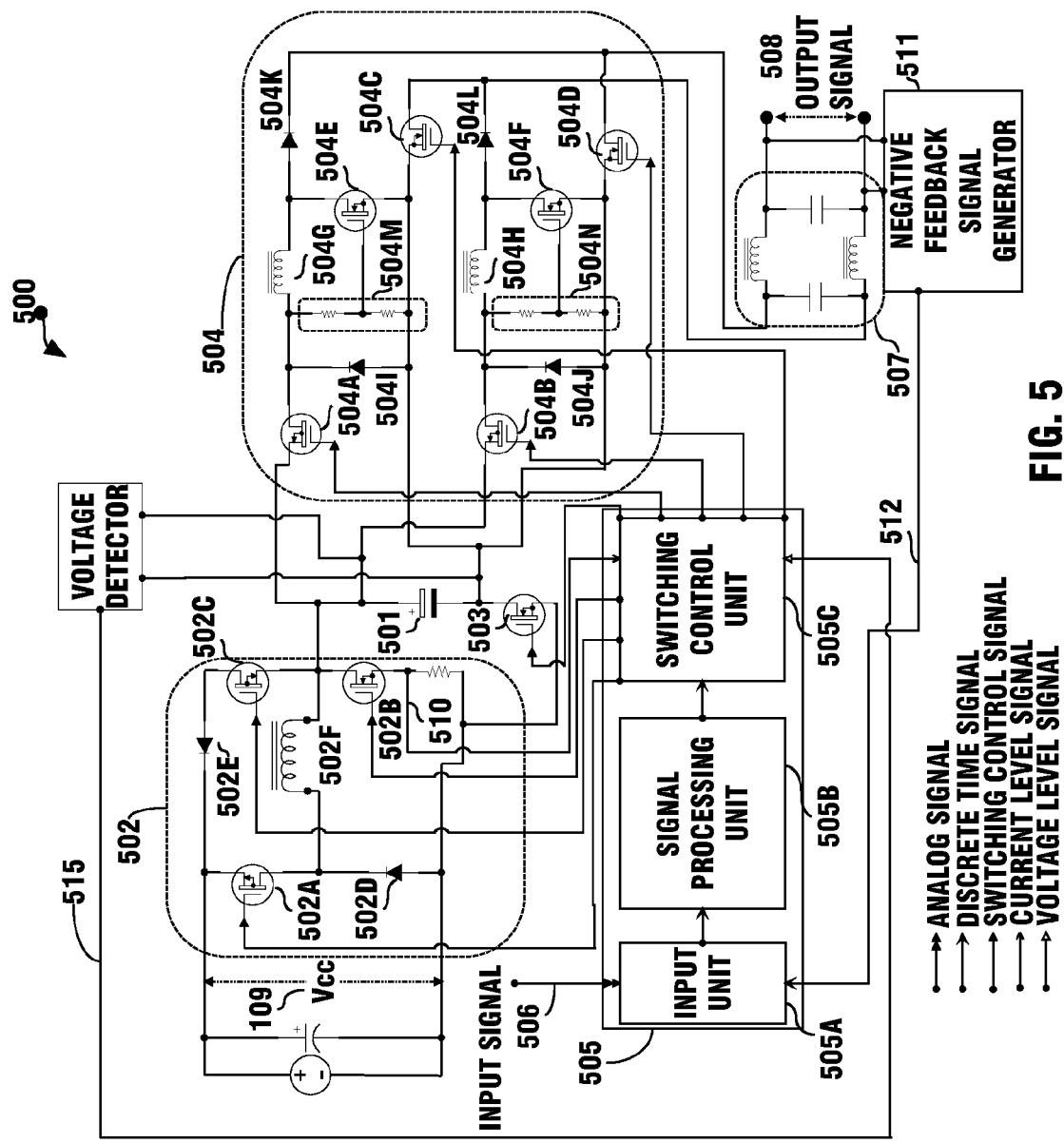
FIG. 5 is an exemplary block and circuit diagram illustrating a second embodiment of a switching amplifier in accordance with the second method of present invention.

FIG. 5 is an exemplary block and circuit diagram illustrating a second embodiment of a switching amplifier in accordance with the second method of present invention.

As illustrated in FIG. 5, the switching amplifier 500 for amplifying an input signal 506 having positive and negative polarities is comprised of: a capacitor means 501; a current regulator unit 502 comprising switches 502A, 502B, 502C, diodes 502D, 502E and an inductor 502F for supplying a direct current (DC) current to the capacitor means 501 from a direct current (DC) voltage 509; a switching unit 503 for switching the current from the current regulator unit 502 to the capacitor means 501; a switching power transmitting unit 504 coupled between the capacitor unit 501 and a filter unit 507 for blocking a current from the capacitor unit 501 to the filter unit 507 when the current from the current regulator unit 502 to the capacitor means 501 is switched on by the switching unit 503, and conducting the current from the capacitor means 501 to the filter unit 507 for transmitting energy stored in the capacitor means 501 to the filter unit 507 when the current from the current regulator unit 502 to the capacitor unit 501 is switched off; the filter unit 507 outputting the output signal 508.

In this non-limiting exemplary embodiment, the input signal 506 is an analog signal. And it's obvious for a corresponding embodiment of a switching amplifier in accordance with this invention for an input signal which is a discrete time signal.

As further illustrated in FIG. 5, the capacitor means 501 is a polarized capacitor. Accordingly, when the current from the current regulator unit 502 to the capacitor means 501 is switched on, the current from the capacitor means 501 to the filter unit 507 is blocked by the switching power transmitting unit 504. Therefore, during this switched on period, the voltage across the capacitor means 501 builds up from zero to a peak value, if the current form the current regulator unit 502 is a constant current, then the voltage across the capacitor means 501 builds up linearly, otherwise, it builds up nonlinearly. Furthermore, when the current from the current regulator unit 502 to the capacitor means 501 is switched off, the current from the capacitor means 501 to the filter unit 507 is conducted by the switching power transmitting unit 504 for delivering previously stored energy to the filter unit 507.

Therefore, during the period when the current from the current regulator unit 502 to the capacitor means 501 is switched on, the voltage across the capacitor 501 builds up from zero to a peak value according to the current from the current regulator unit 502. Even the current from the current regulator unit 502 is not a constant current therefore the voltage across the capacitor means 501 builds up nonlinearly, the energy stored in the capacitor means 501 is still determined by the equation:

$$E = \frac{C(V_p)^2}{2}$$

wherein E is the energy stored in the capacitor 501, C is the capacitance of the capacitor 501, and $V_p$ is the value of the voltage across the capacitor 501 at the end of the switched on period. Therefore, the energy stored into the capacitor 501 during a switched on period is determined by the capacitance of the capacitor 501 and the peak value of the voltage at the end of the switched on period.

As further illustrated in FIG. 5, the amplifier control unit 505 comprises: an input unit 505A for receiving the input signal 506 and having an analog to digital converter for converting the input signal 506 to a discrete time input signal x[n]

$$x=\{x[n]\},\ 0<n<\infty;$$

wherein the sampling frequency of the discrete time input signal x[n] is according to the switching frequency of the switching unit 503, therefore, each x[n] is corresponding to instantaneous amplitude of the input signal which corresponding to energy to be delivered at each switching.

A signal processing unit 505B for transforming the discrete time input signal x[n] to a discrete time peak voltage signal $V_p$ [n] according to the followings:

$$V_p[n] = \sqrt[2]{\frac{x[n]}{x_{max}}} \times V_{pmax} \quad 0 < n < \infty;$$

wherein $x_{max}$ is the maximum value of the discrete time input signal and $V_{pmax}$ is the maximum value of peak voltage across the capacitor 501 at the end of the switched on period corresponding to $x_{max}$. Wherein the $x_{max}$ and $V_{pmax}$ are all design parameters of the switching amplifier 500.

A switching control unit 505C coupled to the switches 502A, 502B and 502C of the current regulator unit 502; the switching unit 503 and the switches 504A, 504B, 504C and 504D of the switching power transmitting unit 504 to control their switching according to the discrete time peak voltage signal $V_p$[n] and a negative feedback voltage signal 515 corresponding to the voltage across the capacitor 501. When the input signal 506 is zero, the switching unit 503 and the switches 504A, 504B, 504C and 504D of the switching power transmitting unit 504 are all switched off. The switches 502A, 502B and 502C switch on and off alternatively to charge and discharge the inductor 502F: when the switches 502A, 502B switch on and 502C switches off, the inductor 502F is charging energy from the direct current (DC) voltage 509, and when the switches 502A, 502B switch off and 502C switches on, the energy contained in the inductor 502F is discharged back to the direct current (DC) voltage 509. Therefore, at steady state, for approximately equal charging and discharging time, the energy flow in and out of the inductor 502F are equal during each switching, therefore, the average value of the current flow through the inductor 502F keeps constant.

When the input signal 506 is not zero, the switching unit 503 switch the current from the current regulator unit 502 to the capacitor 501 according to the discrete time peak voltage signal $V_p$[n] and the negative feedback voltage signal 515, for example, at start of each switching, for that the polarity of $V_p$[n] is positive, the switching control unit 505C switches on the switching unit 503 and compares the discrete time peak voltage signal $V_p$[n] to the negative feedback voltage signal 515. When the negative feedback voltage signal 515 reaches $V_p$[n], the switching control unit 505C switches off the switch 503, switches on the switch 504A and 504C, and waits for next switching start. For that the polarity of $V_p$[n] is negative, the switching control unit 505C switches the switches 503, 504B, 504D according to the discrete time peak voltage signal $V_p$[n] and the negative feedback voltage signal 515, respectively. Accordingly, the switches 502A, 502B, 502C switches according to the switching of switch 503 and the current level feedback signal 510 representing a current flow through the inductor 502F to keep the average value of the current flow through the inductor 502F constant.

As further illustrated in FIG. 5, the filter unit 507 is a low pass filter to obtain the output signal 508 corresponding to the input signal 506 by filtering the output of the switching power transmitting unit 504 and outputting the output signal 508.

As further illustrated in FIG. 5 and FIG. 4, for replacing the current regulator unit 502 in FIG. 5 by the current regulator unit 400 can have the advantage of providing electric isolation between an AC Line in and a switching amplifier 500.

As further illustrated in FIG. 5, the switching amplifier 500 further comprises a negative feedback signal generator 511 to generate a negative feedback signal corresponding to the output signal 512, wherein the amplifier control unit 505 integrates the input signal 106 and the negative feedback signal 512.

From the switching amplifiers 100 and 500 in accordance with the present invention, one aspect of the present invention provides a switching amplifier that is highly efficient and without the "dead time" problem related to the class D amplifiers. Accordingly, the switches of the switching amplifiers 100 and 500 are never short the direct current (DC) voltage through themselves.

From the switching amplifiers 100 and 500 in accordance with the present invention, another aspect of the present invention provides a switching amplifier that is completely off when there is no input signal, as illustrated in FIG. 2.

From the switching amplifiers 100 and 500 in accordance with the present invention, yet another aspect of the present invention provides a switching amplifier comprised of an act of comparing an input signal with an output feedback signal for detection and correction of overall system signal processes therefore is substantially immune to DC current source supply and load perturbations, as illustrated in FIGS. 1, 3 and 5.

It is to be understood that the above described embodiments are merely illustrative of the principles of the invention and that other arrangements may be devised by those skilled in the art without departing from the spirit and scope of the invention.

What is claimed is:

1. A method of obtaining an output signal from a direct current (DC) current source, wherein the output signal is a linearly amplified replica of an input signal, comprising the steps of:
   receiving the input signal;
   transforming and pulse modulating the input signal for generating a pulse modulated signal, wherein said transforming is based on that when applying a constant current to a capacitor means, the energy stored in the capacitor means is proportional to square of the applying time;
   switching the constant current from the direct current (DC) current source to the capacitor means according to the pulse modulated signal;
   blocking a current from the capacitor means to a filter when the constant current from the direct current (DC) current source to the capacitor means is switched on and conducting the current from the capacitor means to the filter for transmitting energy stored in the capacitor means to the filter when the constant current from the direct current (DC) current source to the capacitor means is switched off for generating a pulsed output signal;
   filtering the pulsed output signal for outputting the output signal by the filter.

2. The method of claim 1 further comprising:
   obtaining the direct current (DC) current source from a direct current (DC) voltage.

3. The method of claim 2 further comprising:
   obtaining the direct current (DC) voltage from an alternating current (AC) voltage.

4. The method of claim 1 further comprising:
   getting a feedback signal by detecting the output signal and integrating the feedback signal to process a negative feedback control.

5. A method of obtaining an output signal from a direct current (DC) current source, wherein the output signal is a linearly amplified replica of an input signal, comprising the steps of:
   receiving the input signal;

transforming the input signal for generating a discrete time peak voltage signal, wherein said transforming is based on that when applying a current to a capacitor means, the energy stored in the capacitor means is proportional to square of the peak voltage across the capacitor means;

switching the current from the direct current (DC) current source to the capacitor means and getting a feedback voltage signal by detecting voltage across the capacitor means, wherein said switching is according to the discrete time peak voltage signal and the feedback voltage signal;

blocking a current from the capacitor means to a filter when the current from the direct current (DC) current source to the capacitor means is switched on and conducting the current from the capacitor means to the filter for transmitting energy stored in the capacitor means to the filter when the current from the direct current (DC) current source to the capacitor means is switched off for generating a pulsed output signal;

filtering the pulsed output signal for outputting the output signal by the filter.

6. The method of claim 5 further comprising:
obtaining the direct current (DC) current source from a direct current (DC) voltage.

7. The method of claim 5 further comprising:
obtaining the direct current (DC) voltage from an alternating current (AC) voltage.

8. The method of claim 5 further comprising:
getting a feedback signal by detecting the output signal and integrating the feedback signal to process a negative feedback control.

9. A switching amplifier for amplifying an input signal having first and second polarities, said amplifier comprising:
a capacitor means comprising one or more than one capacitors;
a switching unit coupled to the capacitor unit for switching a current from a direct current (DC) current source to the capacitor means;
a switching power transmitting unit coupled between the capacitor unit and a filter unit for blocking a current from the capacitor unit to the filter unit when the current from the direct current (DC) current source to the capacitor means is switched on by the switching unit, and conducting the current from the capacitor means to the filter unit for transmitting energy stored in the capacitor means to the filter unit when the current from the direct current (DC) current source to the capacitor unit is switched off;
an amplifier control unit for receiving the input signal and coupled to the switching unit and the switching power transmitting unit to control their switching according to the input signal;
the filter unit to obtain an output signal corresponding to the input signal by filtering the output of the switching power transmitting unit and outputting the output signal.

10. The switching amplifier according to claim 9, further comprising:
a current regulator unit for obtaining the direct current (DC) current source from a direct current (DC) voltage.

11. The switching amplifier according to claim 10, further comprising:
a rectifying and smoothing unit to rectify and smooth an alternating current (AC) voltage and to provide the direct current (DC) voltage.

12. The switching amplifier according to claim 9, further comprising:
a negative feedback voltage signal generator to generate a negative feedback voltage signal corresponding to the voltage across the capacitor means,
wherein the amplifier control unit integrates the input signal and the negative feedback voltage signal to process a negative feedback control.

13. The switching amplifier according to claim 9, further comprising:
a negative feedback signal generator to generate a negative feedback signal corresponding to the output signal,
wherein the amplifier control unit integrates the input signal and the negative feedback signal to process a negative feedback control.

14. The switching amplifier according to claim 9, further comprising:
a negative feedback voltage signal generator to generate a negative feedback voltage signal corresponding to the voltage across the capacitor means,
a negative feedback signal generator to generate a negative feedback signal corresponding to the output signal,
wherein the amplifier control unit integrates the input signal, the negative feedback voltage signal and the negative feedback signal to process a negative feedback control.

15. The switching amplifier according to claim 9, wherein the input signal is an analog signal.

16. The switching amplifier according to claim 9, wherein the input signal is a discrete time signal.

17. The switching amplifier according to claim 9, wherein the filter unit is a low pass filter.

18. The switching amplifier according to claim 9, wherein the filter unit is a band pass filter.

19. The switching amplifier according to claim 9, wherein the filter unit is a band stop filter.

* * * * *